(12) United States Patent
Do et al.

(10) Patent No.: US 8,193,610 B2
(45) Date of Patent: Jun. 5, 2012

(54) SEMICONDUCTOR DEVICE AND METHOD OF FORMING B-STAGE CONDUCTIVE POLYMER OVER CONTACT PADS OF SEMICONDUCTOR DIE IN FO-WLCSP

(75) Inventors: Byung Tai Do, Singapore (SG); Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 85 days.

(21) Appl. No.: 12/853,898

(22) Filed: Aug. 10, 2010

(65) Prior Publication Data

US 2012/0038047 A1 Feb. 16, 2012

(51) Int. Cl.
*H01L 23/58* (2006.01)
(52) U.S. Cl. ........ 257/594; 257/753; 257/779; 257/787; 257/E23.116
(58) Field of Classification Search .................. 257/594, 257/753, 779, 787
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,611,140 A | 3/1997 | Kulesza et al. | |
| 5,841,193 A | 11/1998 | Eichelberger | |
| 6,797,544 B2 * | 9/2004 | Sakai et al. | 438/121 |
| 7,335,988 B2 | 2/2008 | Farnworth et al. | |
| 7,385,282 B2 | 6/2008 | Shen | |
| 7,619,901 B2 | 11/2009 | Eichelberger et al. | |
| 7,800,233 B2 * | 9/2010 | Kawano et al. | 257/774 |
| 2003/0137062 A1 * | 7/2003 | Akram et al. | 257/788 |
| 2007/0284758 A1 | 12/2007 | Zhang et al. | |

* cited by examiner

*Primary Examiner* — Wai Sing Louie
(74) *Attorney, Agent, or Firm* — Robert D. Atkins; Patent Law Group: Atkins & Associates, P.C.

(57) ABSTRACT

A semiconductor wafer contains a plurality of semiconductor die with bumps formed over contact pads on an active surface of the semiconductor die. A b-stage conductive polymer is deposited over the contact pads on the semiconductor wafer. The semiconductor wafer is singulated to separate the die. An insulating layer is formed over a carrier with openings formed in the insulating layer. The die is mounted to the carrier with the conductive polymer disposed in the openings of the insulating layer. The conductive polymer is heated to a glass transition temperature to liquefy the conductive polymer to an electrically conductive state. An encapsulant is deposited over the die and insulating layer. The carrier is removed to expose the conductive polymer. An interconnect structure is formed over the die, encapsulant, and conductive polymer. The interconnect structure is electrically connected through the conductive polymer to the contact pads on the die.

20 Claims, 6 Drawing Sheets

SEMICONDUCTOR DEVICE AND METHOD OF FORMING B-STAGE CONDUCTIVE POLYMER OVER CONTACT PADS OF SEMICONDUCTOR DIE IN FO-WLCSP

FIELD OF THE INVENTION

The present invention relates in general to semiconductor devices and, more particularly, to a semiconductor device and method of forming a b-stage conductive polymer over contact pads of a semiconductor die in a fan-out wafer level chip scale package (Fo-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional Fo-WLCSP 10 including semiconductor die 12 having contact pads 14 and solder bumps 16 formed over active surface 18. Semiconductor die 12 is a flipchip type semiconductor die. An encapsulant 20 is deposited over semiconductor die 12 and around bumps 16. A build-up interconnect structure 22 is formed over encapsulant 20 and semiconductor die 12. The interconnect structure 22 includes a conductive layer 24 and insulating layer 26 for electrical isolation of the conductive layer. Bumps 30 are formed over conductive layer 24.

Many semiconductor devices require a fine pitch between the interconnect structures, e.g., between contact pads on a flipchip semiconductor die, for a high interconnect density and input/output (I/O) terminal count. Wettable contact pads 28 are typically formed between conductive layer 24 and bumps 16 to help contain the bump material during reflow. However, bumps 16 are prone to cracking, particularly during thermal cycling test. In addition, bumps 16 are known to delaminate from wettable contact pads 28, and the wettable pads can delaminate from conductive layer 24. The high temperature needed for bump reflow can subject the semiconductor wafer to degradation and damage.

SUMMARY OF THE INVENTION

A need exists to provide a fine pitch interconnect for a semiconductor die without using bumps and wettable contact pads to electrically interconnect the semiconductor die. Accordingly, in one embodiment, the present invention is a method of making a semiconductor device comprising the steps of providing a semiconductor wafer having a plurality of semiconductor die with contact pads formed on an active surface of the semiconductor die, depositing a conductive polymer over the contact pads on the semiconductor wafer, singulating the semiconductor wafer to separate the semiconductor die, providing a carrier, forming a first insulating layer over the carrier, forming a plurality of openings in the first insulating layer, mounting the semiconductor die to the carrier with the conductive polymer disposed in the openings of the first insulating layer, heating the conductive polymer to a glass transition temperature, depositing an encapsulant over the semiconductor die and first insulating layer, removing the carrier to expose the conductive polymer, and forming an interconnect structure over the semiconductor die, encapsulant, and conductive polymer. The interconnect structure is electrically connected through the conductive polymer to the contact pads on the semiconductor die.

In another embodiment, the present invention is a method of making a semiconductor device comprising the steps of providing a semiconductor die, depositing a conductive polymer over contact pads on the semiconductor die, providing a carrier, forming a first insulating layer over the carrier, forming a plurality of openings in the first insulating layer, mounting the semiconductor die to the carrier with the conductive polymer disposed in the openings of the first insulating layer, heating the conductive polymer to a glass transition temperature, depositing an encapsulant over the semiconductor die and first insulating layer, removing the carrier to expose the conductive polymer, and forming an interconnect structure over the semiconductor die, encapsulant, and conductive polymer. The interconnect structure is electrically connected through the conductive polymer to the contact pads on the semiconductor die.

In another embodiment, the present invention is a method of making a semiconductor device comprising the steps of providing a semiconductor die, depositing a conductive polymer over contact pads on the semiconductor die, heating the conductive polymer to a glass transition temperature, depositing an encapsulant over the semiconductor die, and forming an interconnect structure over the semiconductor die, encapsulant, and conductive polymer. The interconnect structure is electrically connected through the conductive polymer to the contact pads on the semiconductor die.

In another embodiment, the present invention is a semiconductor device comprising a semiconductor die and conductive polymer deposited over contact pads on the semiconductor die. The conductive polymer is heated to a glass transition temperature. An encapsulant is deposited over the semiconductor die. An interconnect structure is formed over the semiconductor die, encapsulant, and conductive polymer. The interconnect structure is electrically connected through the conductive polymer to the contact pads on the semiconductor die.

DETAILED DESCRIPTION OF THE DRAWINGS

Figure 1:
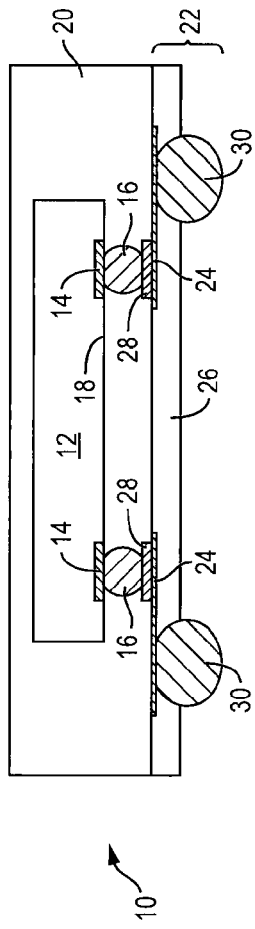
FIG. 1 illustrates a conventional Fo-WLCSP with a semiconductor die electrically connected to an interconnect structure through bumps and wettable contact pads.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
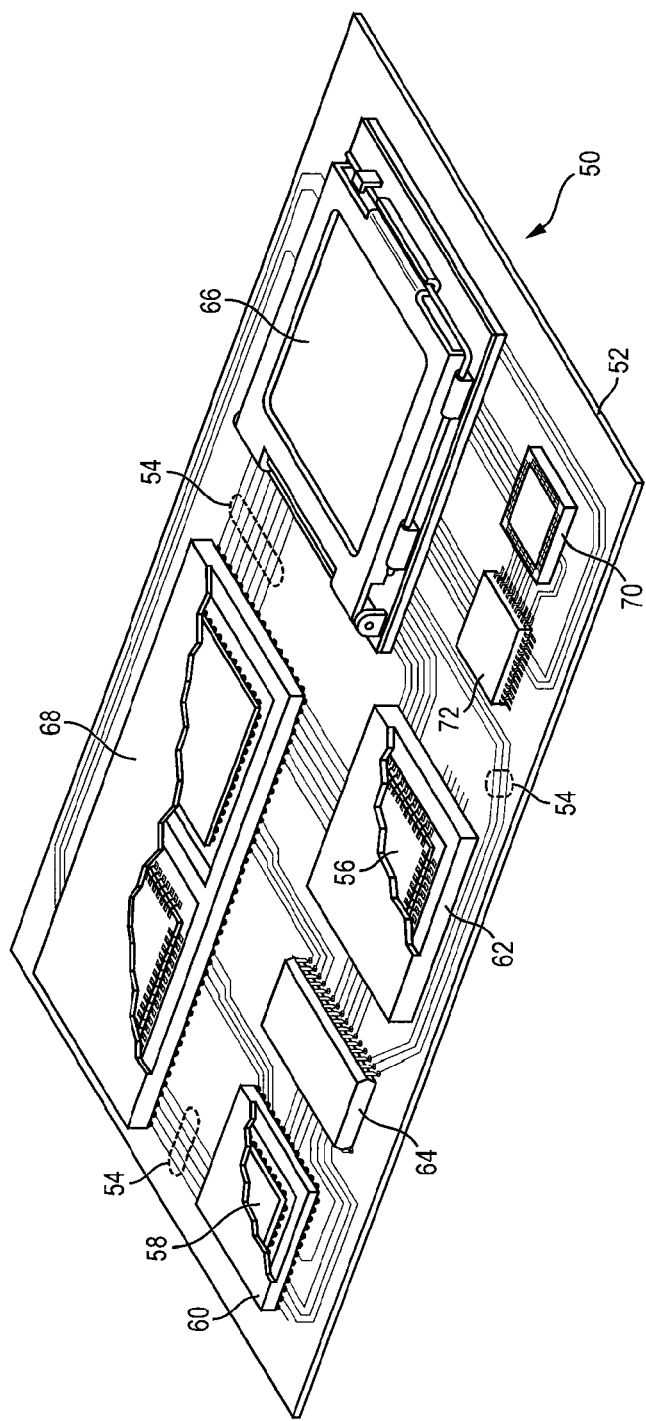
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
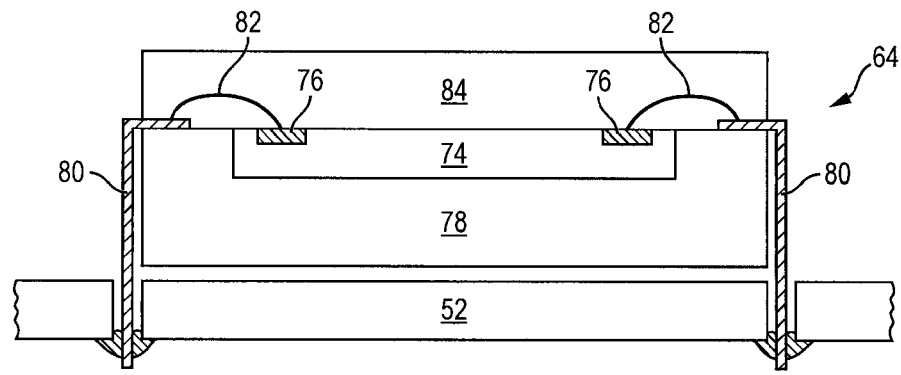
FIGS. 3a-3c illustrate further detail of the representative semiconductor packages mounted to the PCB.
Figure 3B:
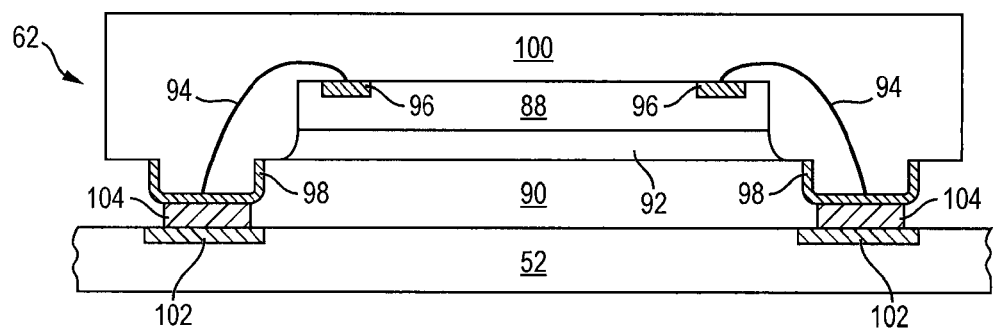
Figure 3C:
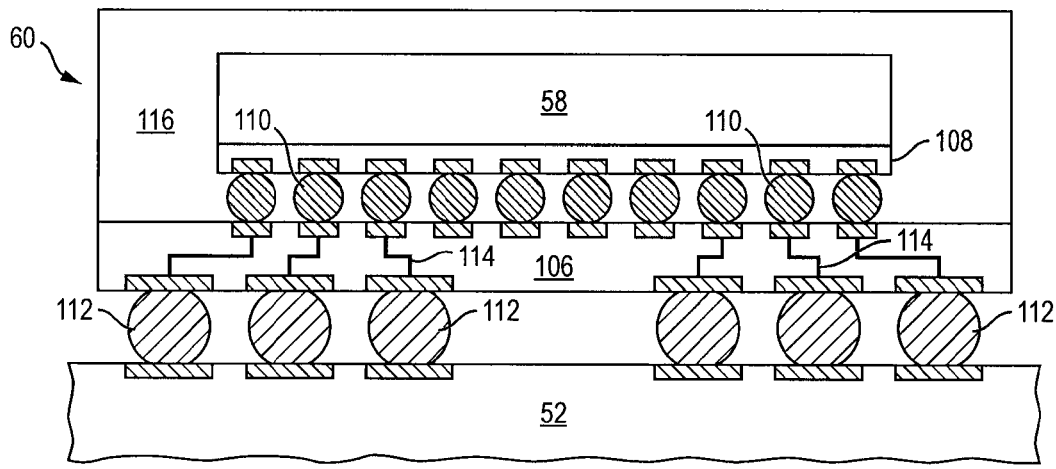

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
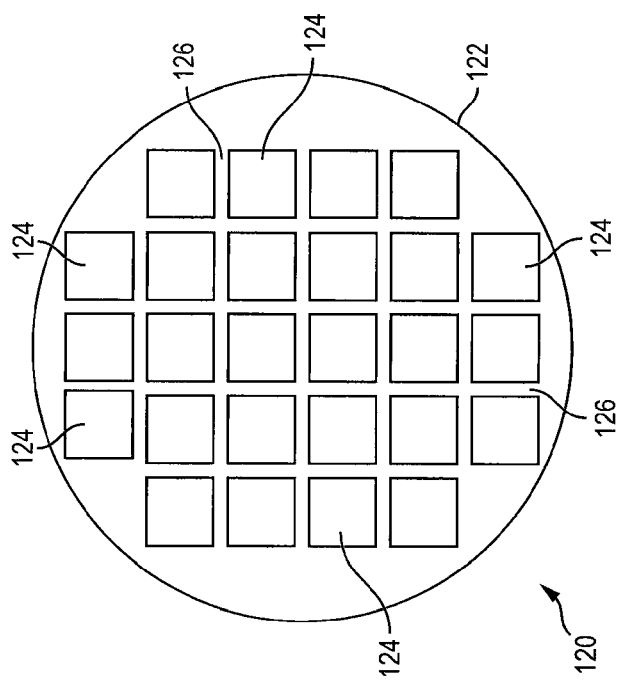
FIGS. 4a-4c illustrate a process of forming a conductive polymer over contact pads on a semiconductor wafer.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 4B:
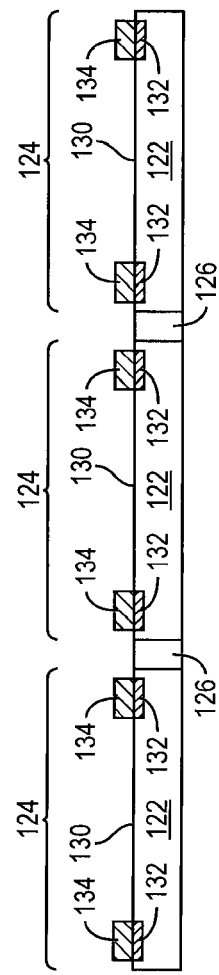

FIG. 4b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. In one embodiment, semiconductor die 124 is a flipchip type semiconductor die.

A conductive polymer 134 is deposited over contact pads 132 of semiconductor wafer 120 using low temperature lamination, screen printing, or other suitable application process. Conductive polymer 134 is b-stage material, such as epoxy or acryl-based material with b-stage properties. In one embodiment, conductive polymer 134 contains metal particles or matrix of conductive particles, each having a polymer core with Ni plating and Au plating and outer polymer coating. Conductive polymer 134 can also be implemented as carbon black, graphite, metals, and carbon nano-tubes.

Figure 4C:
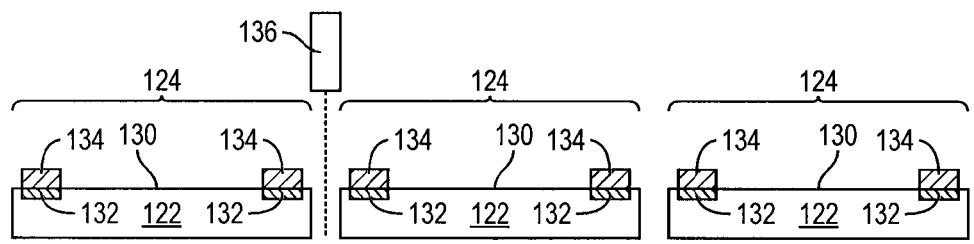

In FIG. 4c, semiconductor wafer 120 is singulated through saw street 126 using saw blade or laser cutting tool 136 into individual semiconductor die 124. Each semiconductor die 124 has conductive polymer 134 over contact pads 132.

Figure 5A:
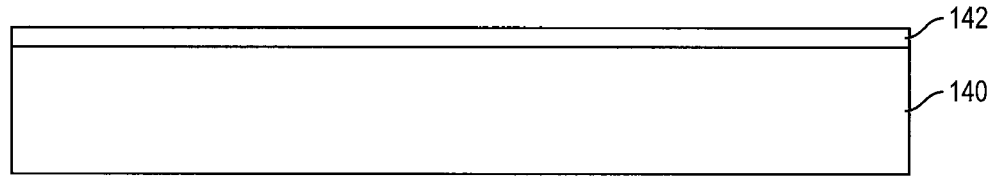
FIGS. 5a-5h illustrate a process of forming a Fo-WLCSP with b-stage conductive polymer formed over contact pads on the semiconductor die.

FIGS. 5a-5h illustrate, in relation to FIGS. 2 and 3a-3c, a process of forming a Fo-WLCSP with a b-stage conductive polymer deposited over the contact pads of a semiconductor die. In FIG. 5a, a temporary carrier or substrate 140 contains sacrificial base material such as silicon, polymer, polymer composite, metal, ceramic, glass, glass epoxy, beryllium oxide, or other suitable low-cost, rigid material for structural support. An optional interface layer or double-sided tape 142 can be formed over carrier 140 as a temporary adhesive bonding film or etch-stop layer.

Figure 5B:
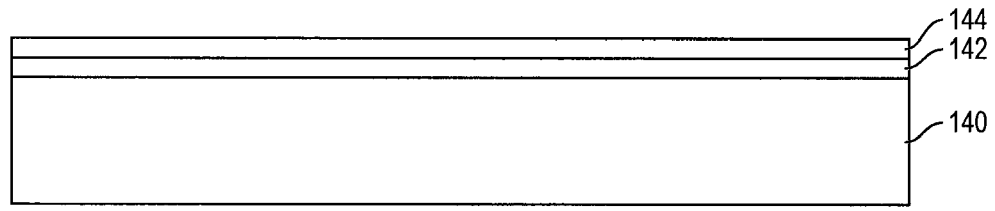

In FIG. 5b, an insulating layer 144 is formed over interface layer 142 as a mask layer using PVD, CVD, printing, spin coating, spray coating, sintering or thermal oxidation. The insulating layer 144 can be photoresist material, dielectric material, epoxy resin, or underfill material.

Figure 5C:
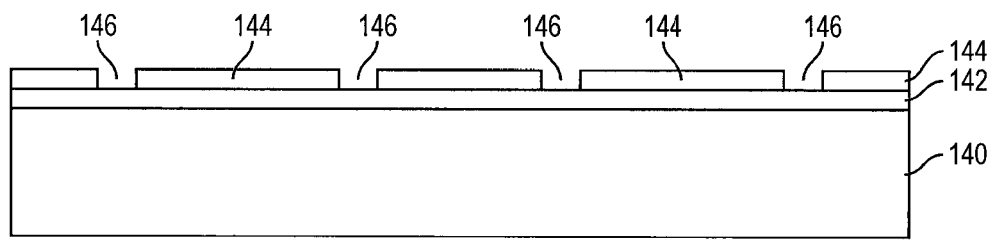

In FIG. 5c, a portion of insulating layer 144 is removed by an etching process to form openings or slots 146 which expose interface layer 142. The openings 146 are larger in width and depth than the volume of conductive polymer 134 formed on contact pads 132.

Figure 5D:
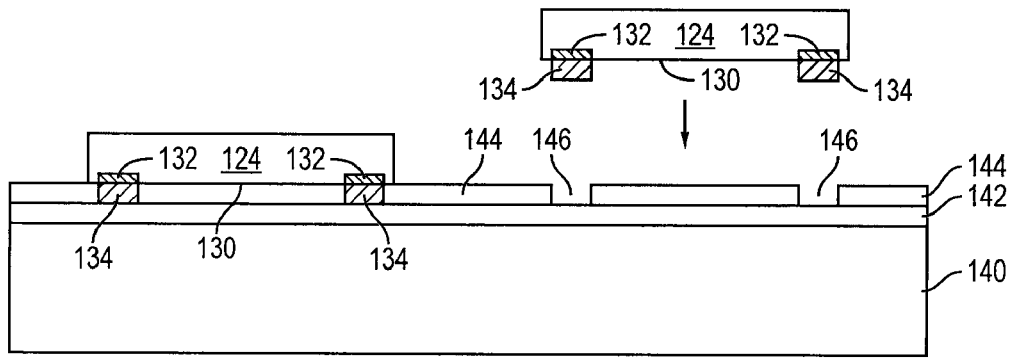

In FIG. 5d, semiconductor die 124, with conductive polymer 134 formed over contact pads 132 from FIGS. 4a-4c, are mounted to carrier 140 with conductive polymer 134 disposed in openings 146. The openings 146 provide accurate alignment of individual semiconductor die 124 to carrier 140, as well as reducing die shifting during encapsulation.

After mounting semiconductor die 124 to carrier 140 with conductive polymer 134 disposed in openings 146, conductive polymer 134 is heated to a glass transition temperature ($T_G$), such as 45-150° C., as necessary to liquefy and transform the conductive polymer to an electrically conductive state. Conductive polymer 134 completely fills openings 146 following the $T_G$ heating process.

Figure 5E:
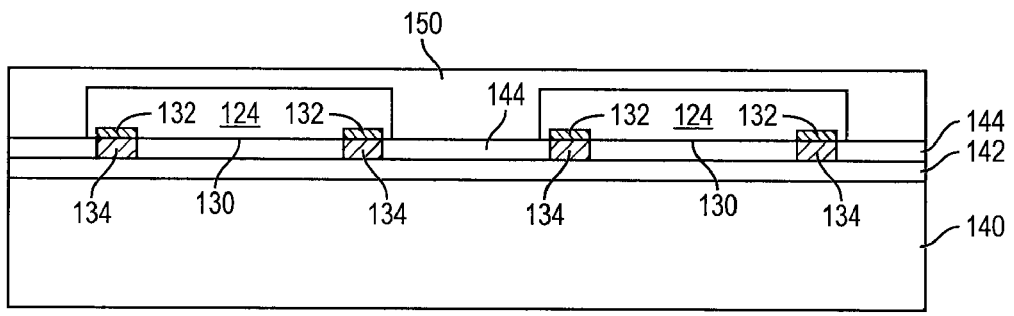

In FIG. 5e, an encapsulant or molding compound 150 is deposited over semiconductor die 124 and insulating layer 144 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants.

Figure 5F:
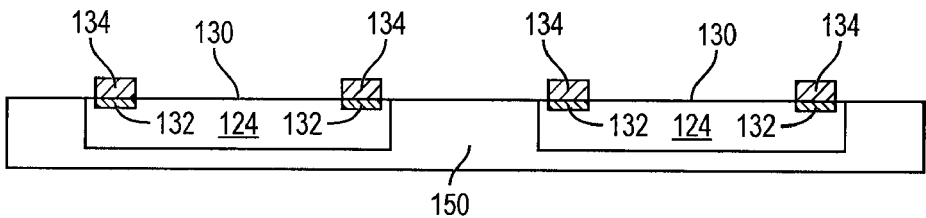

In FIG. 5f, temporary carrier 140, interface layer 142, and insulating layer 144 are removed by chemical etching, mechanical peel-off, CMP, mechanical grinding, thermal bake, UV light, laser scanning, or wet stripping.

Figure 5G:
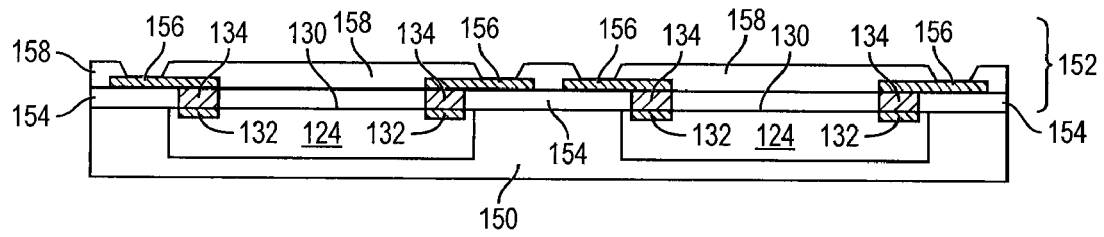

In FIG. 5g, a build-up interconnect structure 152 is formed over semiconductor die 124, conductive polymer 134, and encapsulant 150. The build-up interconnect structure 152 includes an insulating or passivation layer 154 formed using PVD, CVD, printing, spin coating, spray coating, sintering or thermal oxidation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 154 can be removed by an etching process if necessary to expose conductive polymer 134.

An electrically conductive layer or redistribution layer (RDL) 156 is formed over insulating layer 154 using a patterning and metal deposition process such as sputtering, electrolytic plating, and electroless plating. Conductive layer 156 can be one or more layers of Al, Cu, Sn, Ni, Au, Ag, or other suitable electrically conductive material. One portion of conductive layer 156 is electrically connected to conductive polymer 134. Other portions of conductive layer 156 can be electrically common or electrically isolated depending on the design and function of semiconductor die 124.

An insulating or passivation layer 158 is formed over insulating layer 154 and around conductive layer 156 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose conductive layer 156.

Figure 5H:
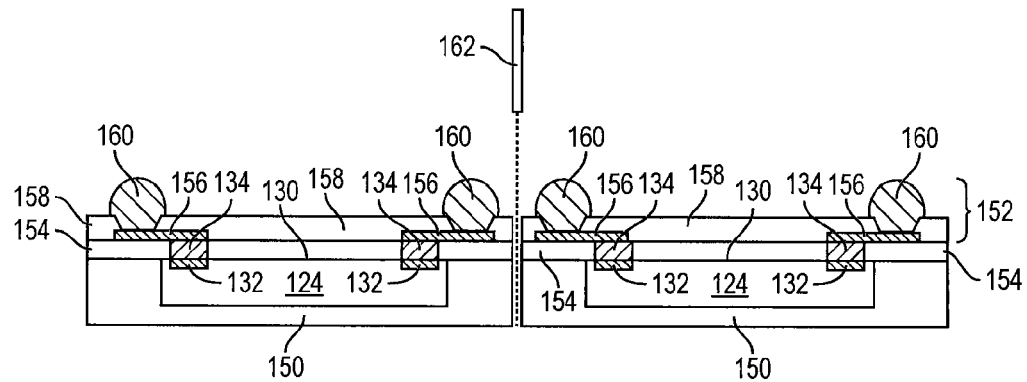

In FIG. 5h, an electrically conductive bump material is deposited over build-up interconnect structure 152 and electrically connected to the exposed portion of conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 160. In some applications, bumps 160 are reflowed a second time to improve electrical contact to conductive layer 156. An under bump metallization (UBM) can be formed under bumps 160. The bumps can also be compression bonded to conductive layer 156. Bumps 160 represent one type of interconnect structure that can be formed over conductive layer 156. The interconnect structure can also use stud bump, micro bump, or other electrical interconnect.

Figure 6:
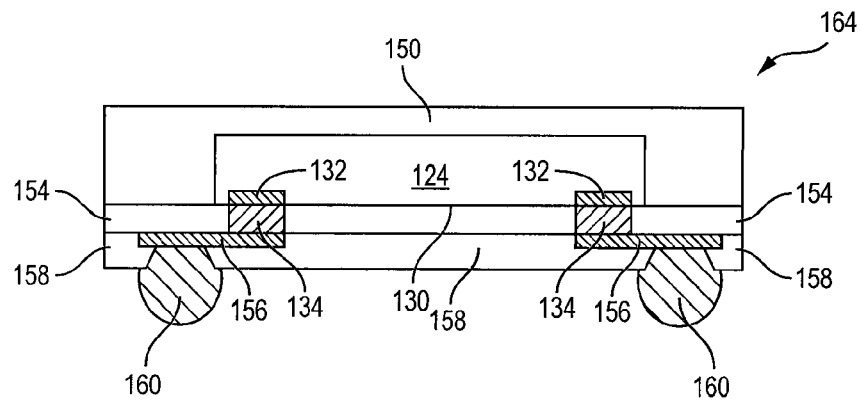
FIG. 6 illustrates the Fo-WLCSP with the b-stage conductive polymer electrically connecting the semiconductor die to the interconnect structure.

Semiconductor die 124 are singulated with saw blade or laser cutting tool 162 into individual Fo-WLCSP 164. FIG. 6 shows Fo-WLCSP 164 after singulation. Semiconductor die 124 is electrically connected through contact pads 132 and conductive polymer 134 to build-up interconnect structure 152 and bumps 160. Conductive polymer 134 provides a simple and cost effective electrical connection between contact pads 132 and interconnect structure 152. Conductive polymer 134 negates the need for wettable contact pads and bumps, as described in FIG. 1.

Figure 7:
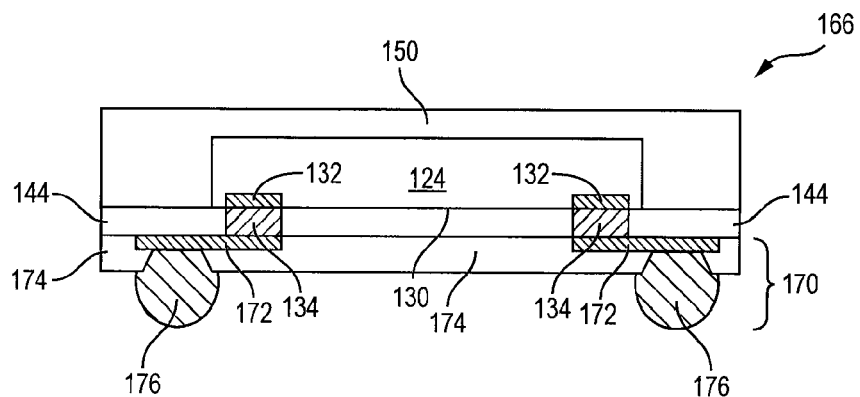
FIG. 7 illustrates the Fo-WLCSP with the insulating layer remaining between the semiconductor die, encapsulant, and interconnect structure as a stress relief buffer.

FIG. 7 shows an embodiment of Fo-WLCSP 166, similar to FIG. 6, with the exception that insulating layer 144 is not removed with carrier 140 in FIG. 5f. The insulating layer 144 remains as a stress relief buffer between semiconductor die 124, encapsulant 150, and interconnect structure 170.

A build-up interconnect structure 170 is formed over conductive polymer 134 and insulating layer 144. The build-up interconnect structure 170 includes an electrically conductive layer or RDL 172 formed over insulating layer 144 using a patterning and metal deposition process such as sputtering, electrolytic plating, and electroless plating. Conductive layer 172 can be one or more layers of Al, Cu, Sn, Ni, Au, Ag, or other suitable electrically conductive material. One portion of conductive layer 172 is electrically connected through conductive polymer 134. Other portions of conductive layer 172 can be electrically common or electrically isolated depending on the design and function of semiconductor die 124.

An insulating or passivation layer 174 is formed over insulating layer 144 and around conductive layer 172 using PVD, CVD, printing, spin coating, spray coating, sintering or thermal oxidation. The insulating layer 174 contains one or more layers of SiO2, Si3N4, SiON, Ta2O5, Al2O3, or other material having similar insulating and structural properties. A portion of insulating layer 174 is removed by an etching process to expose conductive layer 172.

An electrically conductive bump material is deposited over build-up interconnect structure 170 and electrically connected to the exposed portion of conductive layer 172 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form spherical balls or bumps 176. In some applications, bumps 176 are reflowed a second time to improve electrical contact to conductive layer 172. A UBM can be formed under bumps 176. The bumps can also be compression bonded to conductive layer 172. Bumps 176 represent one type of interconnect structure that can be formed over conductive layer 172. The interconnect structure can also use stud bump, micro bump, or other electrical interconnect.

Semiconductor die 124 is electrically connected through contact pads 132 and conductive polymer 134 to build-up interconnect structure 170 and bumps 176. Conductive polymer 134 provides a simple and cost effective electrical connection between contact pads 132 and interconnect structure 170. Conductive polymer 134 negates the need for wettable contact pads and bumps, as described in FIG. 1.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer having a plurality of semiconductor die with contact pads formed on an active surface of the semiconductor die;
   depositing a conductive polymer over the contact pads on the semiconductor wafer;
   singulating the semiconductor wafer to separate the semiconductor die;
   providing a carrier;
   forming a first insulating layer over the carrier;
   forming a plurality of openings in the first insulating layer;
   mounting the semiconductor die to the carrier with the conductive polymer disposed in the openings of the first insulating layer;
   heating the conductive polymer to a glass transition temperature;
   depositing an encapsulant over the semiconductor die and first insulating layer;
   removing the carrier to expose the conductive polymer; and
   forming an interconnect structure over the semiconductor die, encapsulant, and conductive polymer, the interconnect structure being electrically connected through the conductive polymer to the contact pads on the semiconductor die.

2. The method of claim 1, wherein heating the conductive polymer to the glass transition temperature liquefies the conductive polymer to an electrically conductive state.

3. The method of claim 1, wherein the conductive polymer includes b-stage material.

4. The method of claim 1, wherein the first insulating layer provides stress relief between the semiconductor die, encapsulant, and interconnect structure.

5. The method of claim 1, further including removing the first insulating layer prior to forming the interconnect structure.

6. The method of claim 1, wherein forming the interconnect structure includes:
   forming a second insulating layer over the encapsulant and semiconductor die; and
   forming a conductive layer over the second insulating layer.

7. A method of making a semiconductor device, comprising:
   providing a semiconductor die;
   depositing a conductive polymer over contact pads on the semiconductor die;
   providing a carrier;
   forming a first insulating layer over the carrier;
   forming a plurality of openings in the first insulating layer;
   mounting the semiconductor die to the carrier with the conductive polymer disposed in the openings of the first insulating layer;
   heating the conductive polymer to a glass transition temperature;
   depositing an encapsulant over the semiconductor die and first insulating layer;
   removing the carrier to expose the conductive polymer; and forming an interconnect structure over the semiconductor die, encapsulant, and conductive polymer, the interconnect structure being electrically connected through the conductive polymer to the contact pads on the semiconductor die.

8. The method of claim 7, further including depositing the conductive polymer over the contact pads on the semiconductor die while in wafer form.

9. The method of claim 7, wherein heating the conductive polymer to the glass transition temperature liquefies the conductive polymer to an electrically conductive state.

10. The method of claim 7, wherein the conductive polymer includes b-stage material.

11. The method of claim 7, wherein the first insulating layer provides stress relief between the semiconductor die, encapsulant, and interconnect structure.

12. The method of claim 7, further including removing the first insulating layer prior to forming the interconnect structure.

13. The method of claim 7, wherein forming the interconnect structure includes:
   forming a second insulating layer over the encapsulant and semiconductor die; and
   forming a conductive layer over the second insulating layer.

14. A method of making a semiconductor device, comprising:
   providing a semiconductor die;
   depositing a conductive polymer over contact pads on the semiconductor die;
   heating the conductive polymer to a glass transition temperature;
   depositing an encapsulant over the semiconductor die; and
   forming an interconnect structure over the semiconductor die, encapsulant, and conductive polymer, the interconnect structure being electrically connected through the conductive polymer to the contact pads on the semiconductor die.

15. The method of claim 14, further including:
   providing a carrier;
   forming an insulating layer over the carrier;
   forming a plurality of openings in the insulating layer; and
   mounting the semiconductor die to the carrier with the conductive polymer disposed in the openings of the insulating layer prior to heating the conductive polymer to the glass transition temperature.

16. The method of claim 15, further including removing the insulating layer prior to forming the interconnect structure.

17. The method of claim 15, wherein the insulating layer provides stress relief between the semiconductor die, encapsulant, and interconnect structure.

18. The method of claim 14, further including depositing the conductive polymer over the contact pads on the semiconductor die while in wafer form.

19. The method of claim 14, wherein heating the conductive polymer to the glass transition temperature liquefies the conductive polymer to an electrically conductive state.

20. The method of claim 14, wherein the conductive polymer includes b-stage material.

* * * * *